(12) United States Patent
Lederer et al.

(10) Patent No.: US 7,592,698 B2
(45) Date of Patent: Sep. 22, 2009

(54) POWER SEMICONDUCTOR MODULES HAVING A COOLING COMPONENT AND METHOD FOR PRODUCING THEM

(75) Inventors: Marco Lederer, Nürnberg (DE); Rainer Popp, Petersaurach (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 0 days.

(21) Appl. No.: 11/705,729

(22) Filed: Feb. 13, 2007

(65) Prior Publication Data

US 2007/0194443 A1 Aug. 23, 2007

(30) Foreign Application Priority Data

Feb. 13, 2006 (DE) .................. 10 2006 006 424

(51) Int. Cl.
*H01L 23/34* (2006.01)

(52) U.S. Cl. .................. 257/719; 257/785; 438/122

(58) Field of Classification Search ................ 257/719, 257/785, E33.075, E31.131, E23.051; 438/122
See application file for complete search history.

(56) References Cited

U.S. PATENT DOCUMENTS 5,345,107 A * 9/1994 Daikoku et al. ............. 257/717

2004/0089941 A1* 5/2004 Mamitsu et al. ............. 257/718
2007/0187817 A1* 8/2007 Popp .......................... 257/723
2007/0194429 A1* 8/2007 Lederer et al. .............. 257/688

FOREIGN PATENT DOCUMENTS

| DE | 42 37 632 | 5/1994 |
|---|---|---|
| DE | 197 19 703 | 11/1998 |
| DE | 199 03 875 | 8/2000 |
| DE | 101 27 947 | 10/2002 |
| DE | 10 2004 021 927 | 12/2005 |

* cited by examiner

*Primary Examiner*—Theresa T Doan
(74) *Attorney, Agent, or Firm*—Cohen Pontani, Lieberman & Pavane LLP

(57) ABSTRACT

An arrangement with an associated production method, of a power semiconductor module in a pressure contact embodiment and a cooling component. The module includes load terminals embodied as metal molded bodies with a flat portion and a contact device originating at the flat portion, disposed within a housing. Each flat portion is disposed parallel to, and spaced from, the surface of the substrate. Contact feet extend from the flat portions to conductor tracks on the substrate. A pressure plate exerts pressure on the load terminals to hold them in place and establish electrical contact between the contact feet and the conductor tracks, while also establishing thermal contact between the load terminals and the cooling component. The cooling component, the housing, and the pressure plate form a first unit, which is mechanically decoupled from a second unit comprising the substrate and the load terminals.

6 Claims, 2 Drawing Sheets

POWER SEMICONDUCTOR MODULES HAVING A COOLING COMPONENT AND METHOD FOR PRODUCING THEM

BACKGROUND OF THE INVENTION

1. Field of the Invention

The present invention is directed to the field of power semiconductor modules and, more particularly, to a power semiconductor module having a pressure contact embodiment, for disposition on a cooling component, and a method for producing such a semiconductor module.

2. Description of the Related Art

In the prior art, such as German Patent Application No. DE 197 19 703 A1, known power semiconductor modules comprise a housing with at least one electrically insulating substrate disposed thereon, preferably for direct mounting on a cooling component. The substrate in turn includes an insulation body having a plurality of metal connection tracks located thereon. The connection tracks are insulated from one another. Power semiconductor components are located on, and connected to, these connection tracks. Moreover, known power semiconductor modules have terminals for external load and auxiliary terminals and also have internally located connecting elements. These connecting elements are usually wire bond connections.

Pressure-contact power semiconductor modules are also known, of the kind disclosed in German Patent Applications Nos. DE 42 37 632 A1 and DE 199 03 875 A1, or in German Patent No. DE 101 27 947 C1. In the first of these references, the pressure device has a stable, preferably metal, pressure element for pressure buildup, an elastic pad element for pressure storage, and a bridge element for introducing pressure to separate regions of the substrate surface. The bridge element is preferably formed as a molded plastic body with a face oriented toward the pad element, from which face many pressure prongs radiate in the direction of the substrate surface.

By means of this kind of pressure device, the substrate is pressed against a cooling component, and the heat transfer between the substrate and the cooling component is thus permanently assured. The elastic pad element generally maintains constant pressure conditions under various thermal loads and over the entire service life of the power semiconductor module.

German Application No. DE 199 03 875 A1 develops this known pressure element further so that, on the one hand it has an especially advantageous ratio of weight to stability, and, on the other hand, it has electrically insulated lead throughs. To that end, the pressure element is formed as a molded plastic body over a metal core. This metal core has recesses for the leadthrough of terminals, preferably auxiliary terminals in a spring contact embodiment. The molded plastic body surrounds these recesses in such a way that the auxiliary terminals are electrically insulated from the metal core by the plastic molded body.

Further-developed pressure elements are also known which have many pressure prongs on their surface oriented toward the substrate. Preferably, the metal core also has a pre-set sag. When the two provisions are combined, a pressure element of this kind can furnish the entire functionality of an aforementioned pressure device.

German Patent No. DE 101 57 947 C1, describes a power semiconductor module in which the load terminals are embodied such that they extend in portions closely adjacent to and perpendicular to the substrate surface and have contact feet extending therefrom that furnish the electrical contact with the conductor tracks while at the same time exerting pressure on the substrate and thereby establish its thermal contact with a cooling component. The pressure is introduced and stored using means of the prior art.

German Patent Application No. DE 10 2004 021 927 A1, discloses a method for internally insulating power semiconductor modules. In contrast to the known prior art, they are not filled with an insulating silicone gel up to a defined fill level, rather, this application teaches a method for coating the components and connecting elements to be insulated which is quite economical in terms of the amount of silicone gel needed to the insulation form.

SUMMARY OF THE INVENTION

It is therefore an object of the invention to provide improved power semiconductor modules and an improved method for producing them.

It is a further object of the invention to provide a simple power semiconductor module having a pressure contact embodiment.

It is another object of the invention to provide a power semiconductor module in a pressure contact embodiment, and a method for producing such modules, in which arbitrary expansion, including thermal expansions, of the substrate is not transmitted to the housing of the power semiconductor module.

The preferred embodiment of the invention includes an arrangement of a power semiconductor module in a pressure contact embodiment disposed on a cooling component. The power semiconductor module includes: a substrate; at least two power semiconductor components, such as bipolar transistors located on the substrate; a housing; and load terminals and control terminals leading to the outside of the housing. The substrate itself has an insulation body, and on the first main face of the insulation body, oriented toward the interior of the power semiconductor module, it has conductor tracks with load potential. The substrate preferably also has at least one conductor track with control potential for triggering the power semiconductor components.

The power semiconductor module furthermore has load terminals each having a contact device, a flat portion, and a plurality of contact feet extending from the flat portion. The various flat portions are disposed parallel to, and spaced from, the substrate surface. The contact feet extend to the substrate, where they contact the load terminals. For that purpose, they preferably contact the conductor tracks with load potential on the substrate, but alternatively they also contact the power semiconductor components directly.

Moreover, a molded insulation body is preferably disposed between the flat portion of the load terminals, which preferably form a stack, and the substrate. This molded insulation body has recesses for permitting the passage therethrough of the contact feet. The molded insulation body preferably substantially covers the substrate and has openings only for electrical terminals to pass therethrough. It may also be preferred if the molded insulation body has recesses to accommodate fastening devices to retain the power semiconductor module on the cooling component.

In a preferred embodiment of the invention, the housing of the power semiconductor module is solidly joined to the cooling component. The pressure plate is likewise preferably mechanically solidly joined to the housing. Thus, the cooling component, housing, and pressure plate together form a first unit of the arrangement. The substrate is so disposed in the framelike housing, however, that it can move in it within narrow limits, for instance to permit thermal expansion and contraction. Likewise, the load and auxiliary terminals have connections with the housing that can move relative to the housing. The substrate, together with the components, and load and auxiliary terminals, etc., form a second unit. Since the pressure which is applied to the stack is produced by of the elastic pressure-storing means, once again there is not a rigid connection. Thus, the first unit is mechanically decoupled from the second unit, permitting relative movement of the second unit within the first unit.

The freedom of motion of the second unit inside the first unit of the preferred embodiment of the invention provides the substantial advantage that any motion of the substrate, caused for instance by thermal factors, is not transmitted to the housing of the power semiconductor module.

The associated preferred method for producing an arrangement such as described above preferably has the following steps:

Disposing the load terminals in the housing of the power semiconductor module.

Disposing the pressure-storing means above the load terminals.

Preliminarily locking the pressure plate on the pressure-storing means on or in the housing.

Disposing the substrate, electrically insulated by means of an insulation composition, with power semiconductor components disposed thereon, in the recess of the housing, so that the insulation composition forms an adhesive connection between the substrate and the housing.

Disposing at least one power semiconductor module on the cooling component and fastening the housing on the cooling component.

Introducing pressure to the power semiconductor module via the pressure-storing means to the load terminals and urging the contact feet into contact with the substrate, thereby causing thermal contacting with the cooling component by attaching the pressure plate to the housing and/or to the cooling component.

The auxiliary terminals are disposed in guides intended therefore prior to disposing the pressure-storing means above the load terminals. Moreover, it may be especially preferable to embody a provisional locking of the pressure plate on the pressure-storing means in the housing by means of a snap-detent connection between the pressure plate and the housing. It is also preferable to apply the insulation composition first in the form of a bead around the periphery of the respective substrate and then to pot the region located inside the bend.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The preferred embodiment of the invention will be described in further detail in terms of the exemplary embodiments of FIGS. 1 and 2.

DETAILED DESCRIPTION OF THE PRESENTLY PREFERRED EMBODIMENTS

Figure 1:
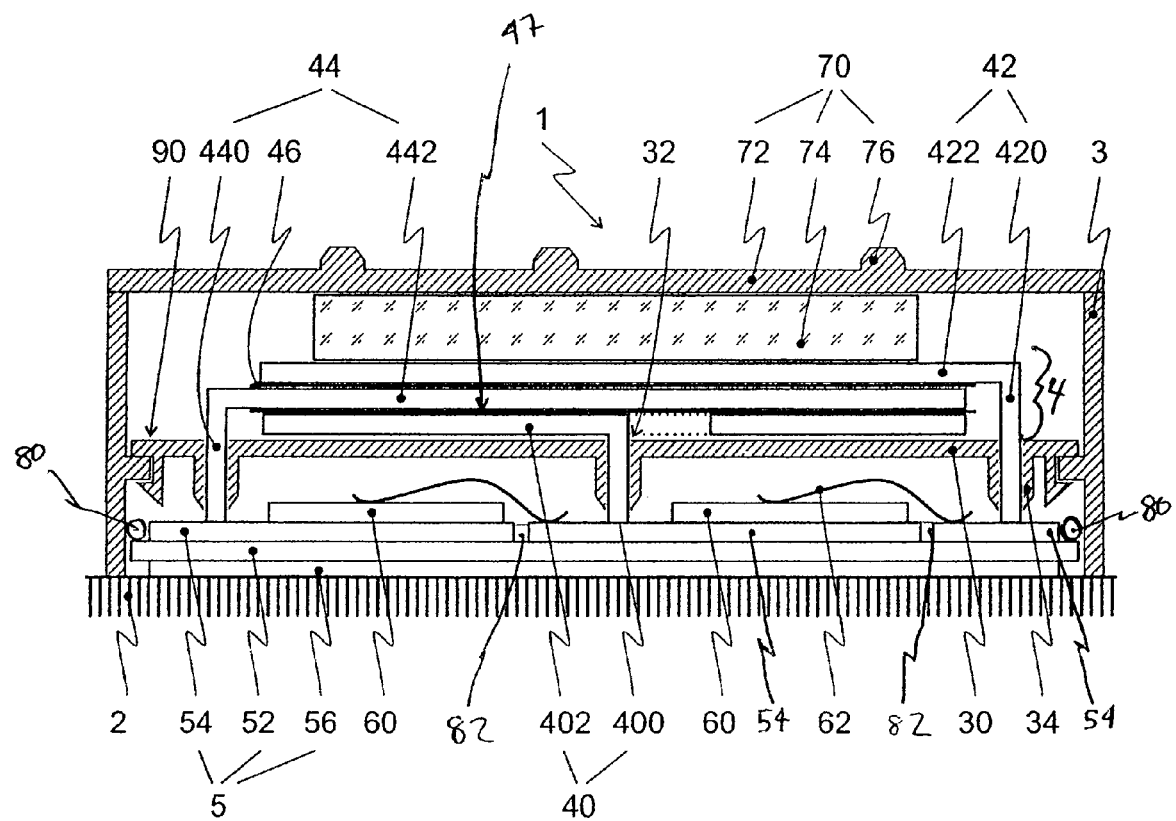
FIG. 1 shows a cross-section through an arrangement according to the invention of a power semiconductor module having a cooling component.

FIG. 1 shows a power semiconductor module 1 in accordance with the invention. Module 1 has a housing 3 with a framelike housing part that is solidly connected to a cooling component 2 of the arrangement and surrounds at least one substrate 5. Substrate 5 in turn has an insulation body 52, preferably formed of an insulating ceramic, such as aluminum oxide or aluminum nitride.

A first main face of substrate 5 is oriented toward the interior of power semiconductor module 1, and has an intrinsically structured metal lining. The individual portions of this metal lining, preferably formed as a copper lining, form conductor tracks 54 of power semiconductor module 1. The second, opposite, main face of substrate 5, as in the prior art, has an unstructured copper lining 56.

Controllable and/or uncontrolled power semiconductor components 60, such as IGBTs (insulated gate bipolar transistors), each with antiparallel-connected fly-wheel diodes, or MOSFETs are disposed on the conductor tracks 54 of the substrate 5. These are connected to further conductor tracks 54, for instance by means of wire bond connections 62.

Power semiconductor module 1 contains a power electronic circuit which has connections to the exterior of housing 3 formed by load terminals 40, 42, 44. Load terminals 40, 42, 44 are conductive, preferably formed as metal molded bodies, which each have one flat portion 402, 422, 442, respectively, disposed parallel to the surface of substrate 5. Flat portions 402, 422, 442 are preferably disposed one atop the other to form a stack 4, with flat portions 402, 422, 442 of the individual load terminals 40, 42, 44 spaced apart from one another solely by means of a required insulation, for instance in the form of plastic films 46, 47. The auxiliary terminals with which module 1 may be used are not shown, for the sake of simplicity.

Preferably, power semiconductor module 1 has an intermediate layer, embodied as a molded insulation body 30, between stack 4 of flat portions 402, 422, 442 of load terminals 40, 42, 44 and substrate 5. This molded insulation body 30 is preferably disposed in this embodiment in the framelike housing 3 by means of a snap-detent connection 90.

Molded insulation body 30 in turn has recesses 32 for permitting the passage therethrough of contact feet 400, 420, 440 of load terminals 40, 42, 44. It is especially preferred if recesses 32 are embodied as guides for contact feet 400, 420, 440, and, as a result, the positioning of. load terminals 40, 42, 44 relative to substrate 5 or conductor tracks 54 is improved still further, compared to an arrangement with mere recesses. According to the invention, recesses 32 have a width in each lateral direction that is suitable for assuring guidance of contact feet 400, 420, 440 while permitting their lateral movement by up to at least about 0.2 mm, preferably up to about 0.3 mm.

A pressure device 70 urges stack 4 downward, thereby providing thermal connection of power semiconductor module 1 to cooling component 2 and simultaneously providing electrical connection between load terminals 40, 42, 44 and conductor tracks 54. Pressure device 70 is formed by a pressure element 72 for pressure buildup and an elastic pad element 74 as a pressure-storing means.

Pressure is introduced to stack 4 via a pad element 74 which transmits downward pressure from pressure element 72 to flat portions 402, 422, 442 of the load terminals 40, 42, 44 and thus exerts downward pressure on contact feet 400, 420, 440. As a result, the latter are urged into electrical connect with conductor tracks 54.

Pressure contacting means 70 of this kind have proven especially contact-secure over the service life of power semiconductor modules 1. Another advantageous aspect for the pressure contacting is the embodiment of recesses 32 of molded insulation body 30 as guides or chutes 34, since, as a result, the positioning of contact feet 400, 420, 440 is especially precise.

Pressure element 72 may be formed, as in the prior art, as a plastic molded body with a suitable metal core on the inside, embodied for instance in bimetallic form, and external reinforcement structures 76. It is also preferred if pressure element 72 simultaneously serves as a cap for power semiconductor module 1.

A first unit of the arrangement is formed here by cooling component 2, housing 3, and pressure element 72. The parts of this unit are solidly joined to one another. A second unit is formed of substrate 5, with power semiconductor components 60 thereon, and load terminals 40, 42, 44. The two units have no mechanically rigid connection with one another; instead, the second unit can move in every lateral direction by at least 0.2 mm, and preferably 0.3, inside the first unit.

Figure 2:
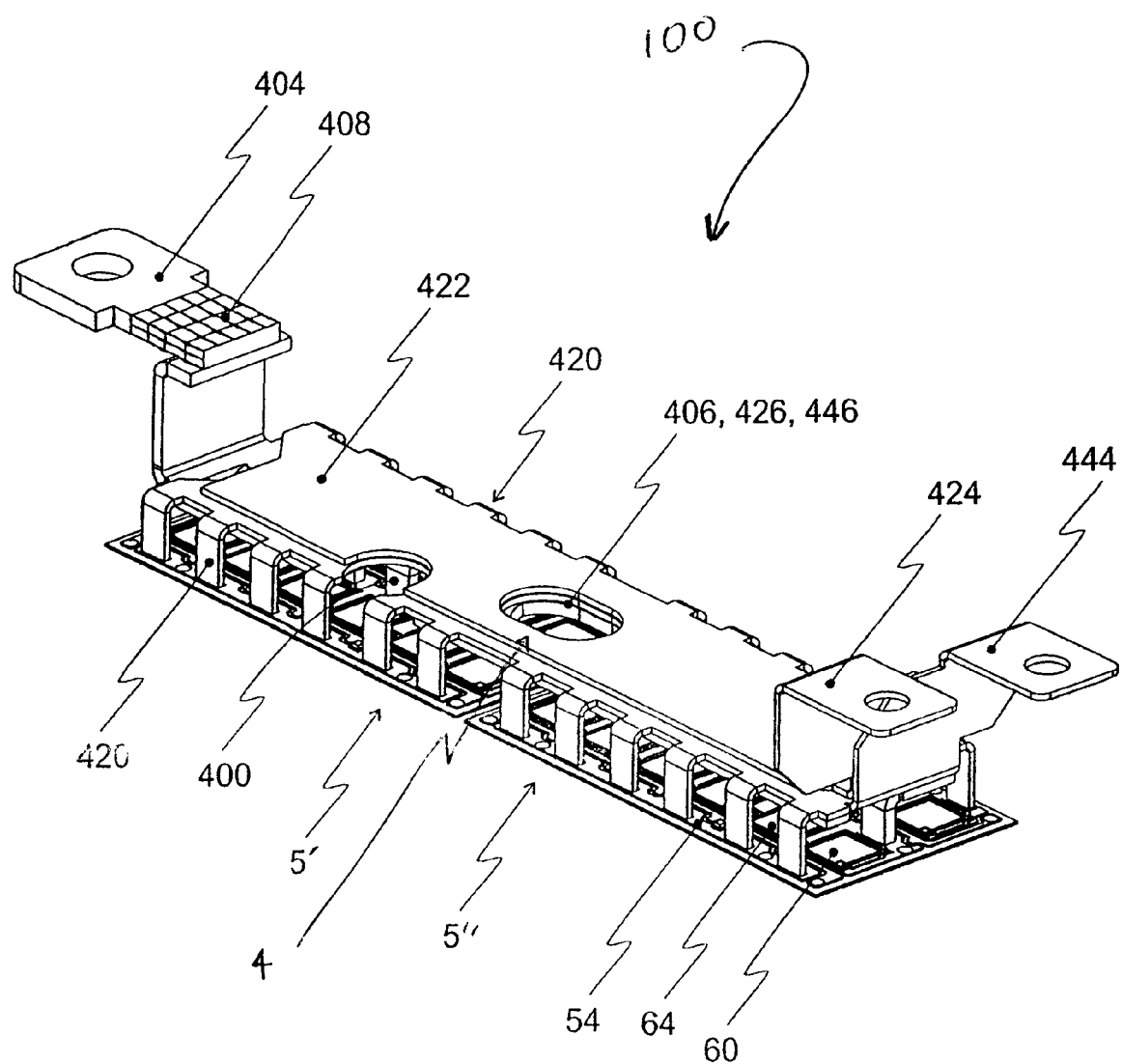
FIG. 2, shows a perspective of the second unit of an arrangement according to the invention.

FIG. 2 shows a perspective view of an arrangement 100 in accordance with the invention. Arrangement 100 includes a first stack 4 essentially identical to the corresponding components of FIG. 1, but intended to be used with two substrates 5', 5".

Substrates 5', 5" have power semiconductor components 60, 64 disposed on conductor tracks 54 and connected by means of bond connections, not shown. The circuit shown is a half-bridge circuit, with a plurality of parallel-connected bipolar transistors 60, 64 forming the first and second switches, respectively. The circuit also has the required flywheel diodes (not separately identified). The first and second switches of the half-bridge circuit are distributed here half on each of the two identical substrates 5', 5".

Load terminals 40, 42, 44 of this second unit of arrangement 100, and their position relative to substrates 5', 5", are also shown. For the sake of simplicity, insulating plastic films 46, 47 (FIG. 1) between individual load terminals 40, 42, 44 are not shown in FIG. 2.

The load terminals 40, 42, 44 have a plurality of contact feet 400, 420, 440, which emanate from associated respective flat portions 402, 422, 442. Each plurality of contact feet 400, 420, 440 of the same polarity here contact the associated conductor tracks 54 of that polarity. The permanently contact-secure electrical connection is embodied by means of the above-described pressure device 70, not shown in FIG. 2.

Recesses 406, 426, 446 of stack 4 of load terminals 40, 42, 44 are also shown and are provided for the arrangement of auxiliary terminals. It is especially preferred if all auxiliary terminals are disposed centrally in the longitudinal direction of power semiconductor module 1. Accordingly, it is advantageous if all the auxiliary terminals are disposed on a lengthwise portion of the power semiconductor module which has at most half the length of the power semiconductor module 1. It is furthermore especially preferred if the auxiliary terminals are embodied as helical springs.

Each load terminal 40, 42, 44 has an associated contact device 404, 424, 444 for connection to circuitry exterior to housing 3 (FIG. 1).

Load terminal 40 includes a mechanically flexible portion 408 disposed between contact device 404 and flat portion 402, above substrate 5' in the course of the load terminals is also shown, in this case being a portion of the alternating current terminals 40 of the power semiconductor module 1.

Mechanically flexible portion 408 is shown in the form here of a copper cloth, of the kind known for flexible load current connections outside a power semiconductor module, and thereby provides for mechanical flexibility in case of small movements of the second unit with response to the first unit, as by thermal expansion. This copper cloth is joined, preferably by welding, to contact device 404 and to an extension of flat portion 402.

As an alternative to flexible portion 408, the lateral freedom of motion of the second unit of at least 0.2 mm in housing 3 (FIG. 1) is shown here by means of suitable guided contact devices 424, 444 of the load terminals.

Substrate 5 may be insulated from housing 3 by laying a bead 80 of a suitable insulation composition, and then potting the region inside of bead 80 with a suitable potting compound 82 (FIG. 1).

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A power semiconductor module in a pressure contact embodiment for placement thereof on a cooling component, wherein the power semiconductor module comprises:

at least one substrate having an insulation body and conductor tracks with load potential disposed on a first main face of said substrate, said first main face facing toward the interior of the power semiconductor module;

at least two power semiconductor components disposed on said at least one substrate;

a housing;

load elements which lead from the interior of said housing to the exterior thereof, said load elements each being formed as a conductive body with a flat portion and contact feet extending from said flat portion, said flat portion being disposed parallel to, and spaced from, the surface of said substrate, said contact feet extending from said flat portion to said conductor tracks of said substrate and into electrical contact therewith;

control elements which lead from the interior of said housing to the exterior thereof; and a dimensionally stable pressure plate including
      a pressure device, and
      an elastic pressure-storing means;

wherein the cooling component, said housing, and said pressure plate together form a first unit, which is mechanically decoupled from a second unit formed of said substrate and said load elements.

2. The power semiconductor module of claim 1, further comprising auxiliary elements disposed centrally in a longitudinal direction of the power semiconductor module, and wherein an associated longitudinal portion of the power semiconductor module has no more than about 50% of the length of the power semiconductor module.

3. The power semiconductor module of claim 1,
wherein said load terminal further includes a contact device for providing electrical connection of said load terminal to external circuitry, said contact device being disposed on the exterior of said housing, and in electrical contact with said flat portion thereof; and
wherein at least one load element has a mechanically flexible portion disposed between said flat portion thereof and said contact device above said substrate.

4. The power semiconductor module of claim 3, wherein said mechanically flexible portion is formed of copper cloth.

5. The power semiconductor module of claim 4, wherein said copper cloth is welded to said load element.

6. The power semiconductor module of claim 1, wherein said at least one substrate has a lateral freedom of motion of at least about 0.2 mm with respect to said housing.

* * * * *